(12) United States Patent
Galy

(10) Patent No.: US 9,571,160 B2
(45) Date of Patent: Feb. 14, 2017

(54) HIGH DATA RATE SERIAL LINK

(71) Applicant: STMicroelectronics SA, Montrouge (FR)

(72) Inventor: Philippe Galy, La Touvet (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 14/821,053

(22) Filed: Aug. 7, 2015

(65) Prior Publication Data

US 2016/0049992 A1 Feb. 18, 2016

(30) Foreign Application Priority Data

Aug. 12, 2014 (FR) ...................... 14 57764

(51) Int. Cl.
*H04B 3/54* (2006.01)
*H04L 7/033* (2006.01)
*H03M 9/00* (2006.01)
*H04L 25/49* (2006.01)

(52) U.S. Cl.
CPC .............. *H04B 3/548* (2013.01); *H03M 9/00* (2013.01); *H04L 7/033* (2013.01); *H04L 25/4917* (2013.01)

(58) Field of Classification Search
CPC .. H04B 2203/5425; H04B 3/548; H03M 9/00; H03M 1/46; H03M 1/66; H04L 7/0091; H04L 25/4917; H04L 7/033
See application file for complete search history.

(56) References Cited

U.S. PATENT DOCUMENTS

| 4,410,879 | A | * | 10/1983 | Gumm | ................... | H03M 1/68 |
| | | | | | | 341/118 |
| 7,221,298 | B1 | * | 5/2007 | Persons | .............. | G01R 31/3191 |
| | | | | | | 341/118 |
| 2002/0133782 | A1 | * | 9/2002 | Noda | ................... | H03M 5/145 |
| | | | | | | 714/792 |
| 2003/0002189 | A1 | * | 1/2003 | Ozdemir | ............ | G11B 5/59633 |
| | | | | | | 360/51 |
| 2005/0231399 | A1 | | 10/2005 | Fowler et al. | | |
| 2005/0237954 | A1 | * | 10/2005 | Hasegawa | ................ | H04B 3/02 |
| | | | | | | 370/292 |

(Continued)

FOREIGN PATENT DOCUMENTS

EP 0407031 A2 1/1991

OTHER PUBLICATIONS

INPI Search Report and Written Opinion for FR 1457764 dated Apr. 14, 2015 (9 pages).

(Continued)

*Primary Examiner* — Vineeta Panwalkar
(74) *Attorney, Agent, or Firm* — Gardere Wynne Sewell, LLP

(57) ABSTRACT

A data transmission circuit transmits a data signal over a transmission line. A digital to analog converter (DAC) operates to receive N-bit input digital values for conversion to corresponding ones of $2^N$ different DC voltage levels. The DAC selects, for each N-bit input digital value, one of the $2^N$ DC voltage levels. An analog to digital converter (ADC) operates to sense the DC voltage on the transmission line for conversion to a corresponding N-bit output digital value.

33 Claims, 3 Drawing Sheets

(56) References Cited

U.S. PATENT DOCUMENTS

| | | | |
|---|---|---|---|
| 2006/0072624 A1* | 4/2006 | Akita | H04L 12/437 370/503 |
| 2010/0111205 A1* | 5/2010 | Hamamura | H04L 27/2628 375/260 |
| 2010/0199157 A1* | 8/2010 | Takaoka | H04L 1/1874 714/800 |

OTHER PUBLICATIONS

I-Hsin Wang et al: "A 4-bit 10GSample/sec flash ADC with merged interpolation and reference voltage," Solid-State Circuits Conference, 2008.A-SSCC '08.IEEE ASIAN.

Munehiko Nagatani et al: "A 32-GS/s 6-Bit Double-Sampling DAC in InP HBT Technology," Compound Semiconductor Integrated Circuit Symposium, 2009. CISC 2009. Annnual IEEE.

\* cited by examiner

HIGH DATA RATE SERIAL LINK

PRIORITY CLAIM

This application claims the priority benefit of French Patent Application No. 1457764, filed on Aug. 12, 2014, the contents of which is hereby incorporated by reference in its entirety to the maximum extent allowable by law.

TECHNICAL FIELD

The present application relates to the field of data transmission between circuits, and more specifically to a serial data link.

BACKGROUND

Data transmission between circuits on or off chip generally uses either a parallel interface or a serial interface.

A parallel interface has the advantage of permitting a relatively high transmission data rate, but because N lines and a clock line are needed for transmitting N bits of data in parallel, such a solution occupies a relatively large chip area, requires a large number of input/output pins and/or has a relatively high power consumption due to the charging and discharging of the capacitance of each line.

A serial interface has the advantage of using very few data lines, but cannot achieve the same data rates as a parallel interface. Indeed, the maximum transmission rate on a given data line will be limited by the capacitance of the line, the effect of which is to create a low-pass filter. Furthermore, due to the charging and discharging of the line capacitance on each change of state of the transmitted data, serial interfaces tend to consume relatively high energy.

There is thus a need in the art for a transmission interface and method of data transmission not suffering from at least some of the above drawbacks.

SUMMARY

It is an aim of embodiments of the present disclosure to at least partially address one or more needs in the prior art.

According to one aspect, there is provided a data transmission circuit for transmitting a data signal over a transmission line, the circuit comprising: a digital to analog converter capable of generating $2^N$ different DC voltage levels, wherein the DAC is adapted to serially receive N-bit digital values, and for each digital value, to select, based on the digital value, one of the $2^N$ DC voltage levels and to apply the selected DC voltage level to the transmission line.

According to one embodiment, the DAC is adapted to apply, for consecutive digital values, the selected DC voltage levels on a rising and falling edge of a clock signal.

According to one embodiment, the data transmission circuit further comprises a multiplexer adapted to receive a plurality of N-bit digital values in parallel, and to time multiplex the plurality of N-bit digital values and provide them serially to the DAC.

According to one embodiment, the multiplexer is adapted to receive two groups of N-bit digital values in parallel, and to time multiplex the two groups of N-bit digital values on rising and falling edges of a clock signal.

According to one embodiment, the DAC comprises an amplifier having an output coupled to the transmission line, the amplifier being adapted to have $2^N$ different gain levels for generating the $2^N$ different DC voltage levels.

According to one embodiment, the data transmission circuit further comprises a clock output line for transmitting a clock signal to a reception circuit.

According to a further aspect, there is provided a data reception circuit for receiving a data signal transmitted over a transmission line, the circuit comprising: an analog to digital converter capable of differentiating between $2^N$ different DC voltage levels, wherein the ADC is adapted to detect DC voltage levels on the transmission line, to convert each detected DC voltage level into a corresponding N-bit data value and to serially provide the N-bit data values at an output of the ADC.

According to one embodiment, the ADC is adapted to generate consecutive N-bit digital values, based on consecutive DC voltage levels, on a rising and falling edge of a clock signal.

According to one embodiment, the data reception circuit further comprises a demultiplexer adapted to receive the N-bit data values at the output of the ADC and to generate a plurality of N-bit digital values in parallel by time demultiplexing a plurality of the N-bit digital values.

According to one embodiment, the demultiplexer is adapted to generate two N-bit digital values in parallel by time demultiplexing the plurality of N-bit digital values on rising and falling edges of a clock signal.

According to one embodiment, the ADC comprises a resistor network adapted to generate $2^N-1$ reference voltage levels, and $2^N-1$ comparators adapted to compare corresponding ones of the reference voltage levels with each DC voltage level detected on the transmission line.

According to a further aspect, there is provided a data transmission interface integrated on an integrated circuit comprising: the above data transmission circuit; the above data reception circuit; and a transmission line connecting the data transmission circuit to the data reception circuit.

According to a further aspect, there is provided a data transmission interface for data transmission between integrated circuits comprising: a first integrated circuit comprising the above data transmission circuit; a second integrated circuit comprising the above data reception circuit; and a transmission line connecting the data transmission circuit to the data reception circuit.

According to a further aspect, there is provided a method of transmitting a data signal over a transmission line, the method comprising: serially receiving, by a digital to analog converter capable of generating $2^N$ different DC voltage levels, N-bit digital values; and for each digital value: selecting, based on the digital value, one of the $2^N$ DC voltage levels; and applying the selected DC voltage level to the transmission line (202).

According to a further aspect, there is provided a method of receiving a data signal transmitted over a transmission line, the method comprising: detecting, by an analog to digital converter capable of differentiating between $2^N$ different DC voltage levels, DC voltage levels on the transmission line; converting each detected DC voltage level into a corresponding N-bit data value; and serially providing the N-bit data values at an output of the ADC.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, the term "connected" is used to designate a direct connection between two elements, whereas the term "coupled" is used to designate a connection that could be direct or via one or more other intermediate elements such as resistors, capacitors or transistors.

Figure 1:
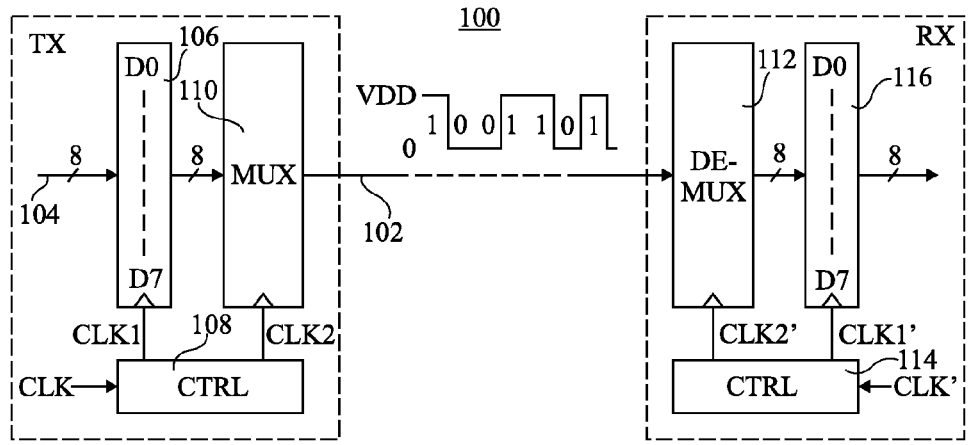
FIG. 1 schematically illustrates an example of a system for serial data transmission.

FIG. 1 schematically illustrates a serial data transmission system 100 comprising a transmission side TX linked to a reception side RX via a transmission line 102.

The transmission side TX comprises an 8-bit bus 104 having data bits D0 to D7, which are synchronized by a flip-flop 106 based on a clock signal CLK1 provided by a control block (CTRL) 108. The 8-bit output of the flip-flop 106 is connected to a multiplexer 110, which transforms the parallel signal into a serial signal by time multiplexing the 8 bits D0 to D7 onto the transmission line 102 based on a clock signal CLK2 also provided by the control block 108. The clock signal CLK2 has eight times the frequency of the clock signal CLK1. The control block 108 generates the clock signals CLK1 and CLK2 based on a clock signal CLK of the transmission side.

The reception side RX comprises a demultiplexer 112, which demultiplexes the serial signal from the transmission line 102 to regenerate the 8-bit parallel data signal, based on a clock signal CLK2' provided by a control block (CTRL) 114. The 8 bits D0 to D7 generated by the demultiplexer 112 are then synchronized by a flip-flop 116 based on a clock signal CLK1'. The clock signals CLK1' and CLK2' are generated by the control block 114 based on a clock signal CLK' of the reception side. For example, a protocol based on start and stop bits transmitted over the transmission line 102 is used to enable the clock CLK2' to be generated without a direct link.

An example of the serial signal generated for one group of eight bits D0 to D7 is represented above the transmission line 102 in FIG. 1 based on NRZ (Non-Return-to-Zero) code. As illustrated, the signal is for example at a ground level 0 when the data bit is a logic 0, and at a supply voltage level VDD when the data bit is a logic 1. The maximum transmission bit rate is defined based on the worst case in which the signal transitions on each significant clock edge, and as explained in the background section above, this rate will be limited by the capacitance of the transmission line 102. Therefore, in order to increase the transmission bit rate, it is not possible to simply increase the transmission frequency.

Figure 2:
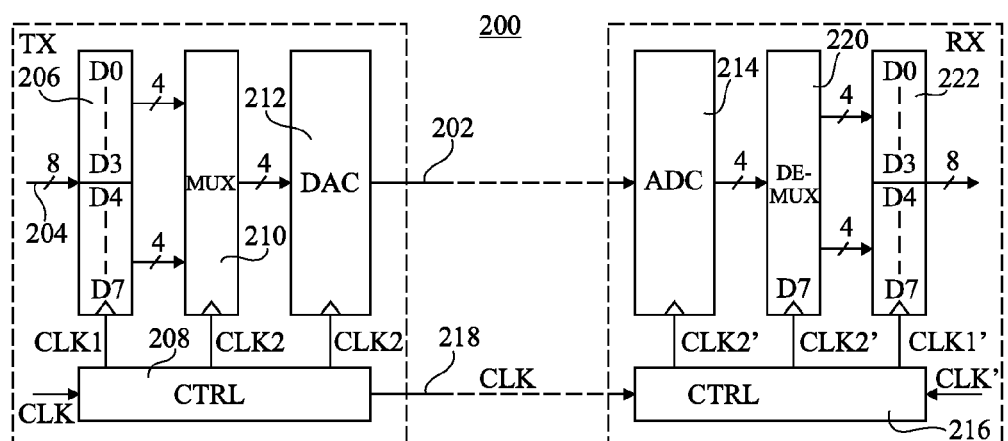
FIG. 2 schematically illustrates a serial data transmission system using multiple voltage levels according to an example embodiment of the present disclosure.

FIG. 2 schematically illustrates a serial data transmission system 200 according to an example embodiment of the present disclosure. The system 200 comprises a transmission side TX linked to a reception side RX via a transmission line 202. In some embodiments, the transmission and reception sides correspond to two different portions of a same integrated circuit, and the transmission line 202 for example corresponds to a conductive track coupling together the two portions. In alternative embodiments, the transmission and reception sides belong to different integrated circuits, and the transmission line 202 is a conductive track or wire connecting together input/output pins of the integrated circuits.

The transmission side TX for example comprises a parallel data bus 204 providing a parallel data signal to a flip-flop 206. In the example of FIG. 2, the parallel data signal is an 8-bit signal, although different sizes would be possible. The flip-flop 206 is clocked by a clock signal CLK1 provided by a control block (CTRL) 208. The flip-flop 206 for example provides the parallel signal in M blocks of N bits to a multiplexer 210. M and N are for example integers each equal to 2 or more. In the example of FIG. 2, M is equal to 2 and N is equal to 4. The multiplexer 210 time multiplexes the M blocks of bits in order to generate an N-bit stream, based on a clock signal CLK2 provided by the control block 208. The clock signal CLK2 is for example M times the frequency of the clock signal CLK1. Alternatively, in some embodiments the multiplexer provides N-bit data values on both rising and falling edges of the clock signal CLK2, in which case the clock signal CLK2 for example has a frequency of M/2 times the frequency of the clock signal CLK1. The control block 208 for example generates the clock signals CLK1 and CLK2 based on a clock signal CLK. In yet further alternative embodiments, M could equal 1, and the multiplexer 210 could thus be omitted.

The transmission side TX also comprises a digital to analog converter (DAC) 212, which receives the N-bit digital values, and converts each digital value into a corresponding one of $2^N$ DC (direct current) voltage levels. In particular, the DAC is for example capable of generating $2^N$ different DC voltage levels, and it selects one of these voltage levels based on each N-bit data value. The DAC applies these DC voltage levels to the transmission line 202 directly. In other words, there is no modulation of any carrier signal, but rather the transmission line is brought in turn to the level of each DC voltage level for the transmission period associated with each data value.

The reception side RX for example comprises an analog to digital converter (ADC) 214, which detects the DC voltage levels on the transmission line 202, and reconverts each DC voltage level into the corresponding N-bit data value. In particular, the ADC 214 is for example capable of differentiating between $2^N$ different DC voltage levels. The conversion is for example based on a clock signal CLK2' provided by a control block (CTRL) 216, which is at the same frequency as the clock signal CLK2 on the transmission side. In some embodiments, the clock signal CLK2' is generated by the control block 216 based on a clock signal CLK' of the reception side. For example, a protocol is implemented in which start and stop bits are transmitted on the transmission line 202 to enable the clock CLK2' to be generated based on the clock signal CLK' without a direct link between the transmission and reception sides. In alternative embodiments, the clock signal CLK2' could be generated by the control block 216 based on a clock signal CLK provided by the transmission side TX on a clock transmission line 218.

The N-bit digital values generated by the ADC 214 are for example provided to a demultiplexer 220, which time demultiplexes the signal based on the clock signal CLK2' to generate a parallel data signal having M groups of N-bits. The parallel data signal is for example output via a flip-flop 222 clocked by clock signal CLK1' provided by the control block 216. The clock signal CLK1' for example has the same frequency as the clock signal CLK1 on the transmission side.

Figure 3:
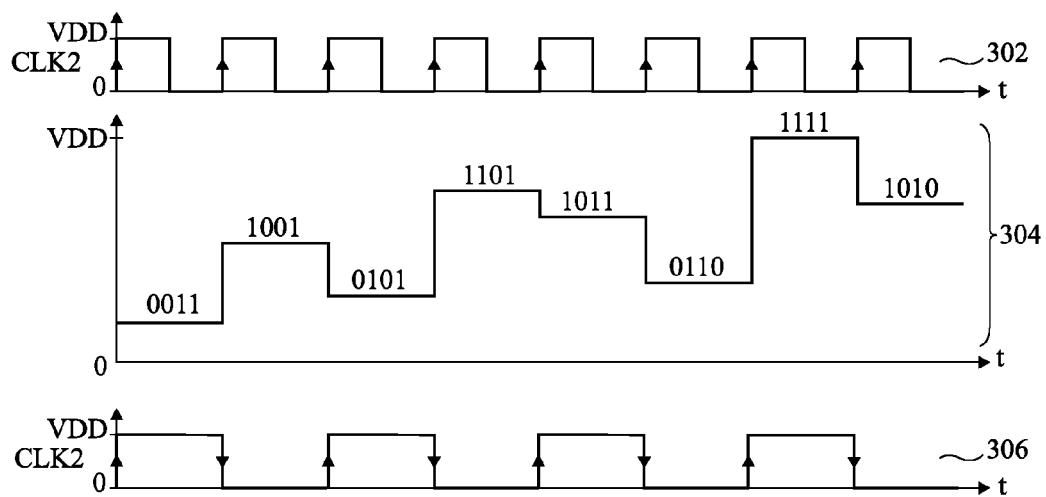
FIG. 3 is a timing diagram showing signals in the circuit of FIG. 2 according to an example embodiment of the present disclosure.

FIG. 3 is a timing diagram showing, labeled 302, an example of the clock signal CLK2, and labeled 304, an example of the serial signal generated by the DAC 212, according to the case in which N is equal to 4, and M is equal to 2. The example of FIG. 3 shows 8 consecutive 4-bit data values having values of 0011, 1001, 0101, 1101, 1011, 0110, 1111 and 1010 respectively. Each digital value is converted into a DC (direct current) voltage level, and in the example of FIG. 3, the value 0000 is represented by the ground DC voltage level, and the value of 1111 is represented by the supply voltage level VDD, which is for example between 1 and 5 V. The other 14 possible values of the 4-bit digital data values, from 0001 to 1110, are represented by corresponding intermediate DC voltage levels between ground and VDD. Each DC voltage level is for example applied from a rising edge of the clock signal CLK2 for the entire clock period until the subsequent rising edge of the clock signal CLK2.

It will be noted from FIG. 3 that it will generally be relatively rare that the DC voltage level changes by the magnitude of VDD from one data value to the next. This is advantageous for both energy efficiency and for relaxing the constraint of the maximum transmission frequency. In some embodiments, an alternative coding to that of FIG. 3 could be applied according to which the most frequently occurring data values are assigned similar voltage values, in order to further reduce the voltage changes between consecutive DC voltage levels in the signal.

FIG. 3 also shows, labeled 306, an example of the clock signal CLK2 according to an alternative embodiment in which the DC voltage levels change on both rising and falling edges of the clock signal CLK2. Thus, each DC voltage level is applied to the transmission line 202 for only half a clock period, and for a given clock frequency, data can be transmitted at twice the data rate when compared to transmitting data only on rising or falling clock edges.

Figure 4:
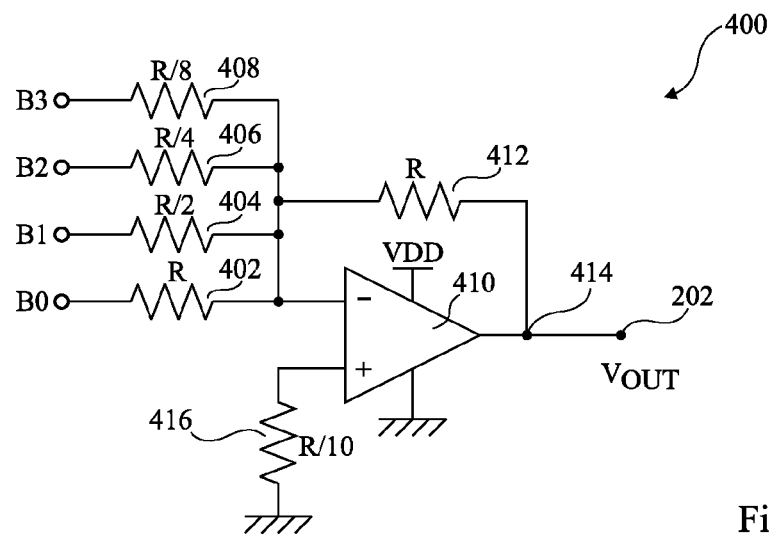
FIG. 4 schematically illustrates a digital to analog converter of the circuit of FIG. 2 in more detail according to an example embodiment of the present disclosure.

FIG. 4 schematically illustrates an example of a DAC 400 that is for example used to implement the DAC 212 of FIG. 2. The DAC 400 is a binary weighted DAC for converting a 4-bit value <B0 . . . B3> into one of 16 DC voltage levels. However, it will be apparent to those skilled in the art how the DAC 400 could be altered to convert an N-bit input signal into 2N corresponding DC levels.

The DAC 400 is based on an amplifier having a gain selected based on the bit values. In particular, the circuit comprises four input nodes for receiving the bits B0 to B3. The four input nodes are respectively coupled to one terminal of resistors 402, 404, 406 and 408 respectively, which have corresponding resistance values of R, R/2, R/4 and R/8. The other terminals of the resistors 402 to 408 are coupled to a negative input terminal of an operational amplifier 410. The negative input terminal of the operational amplifier 410 is also coupled via a resistor 412 to an output node 414 of the amplifier, which provides an output voltage $V_{OUT}$ of the DAC. The resistor 412 for example has a resistance R. The output node 414 is for example connected directly to the transmission line 202. The positive input terminal of the operational amplifier 410 is for example coupled to ground via a resistor 416, which for example has a resistance of R/10. In one embodiment, R is a value of between 5 and 20 k ohms.

Figure 5:
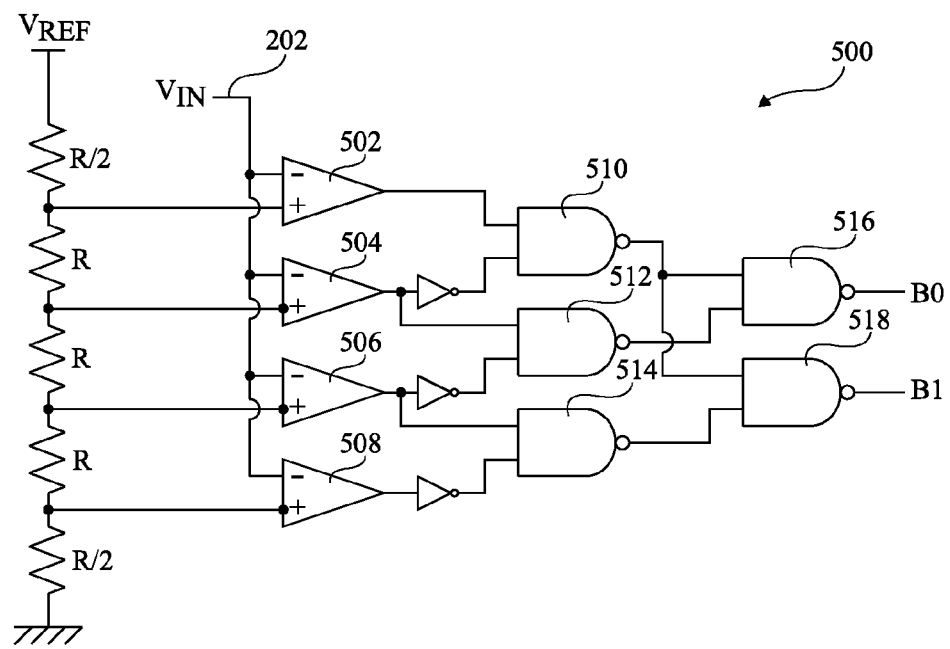
FIG. 5 schematically illustrates an analog to digital converter of the circuit of FIG. 2 in more detail according to an example embodiment of the present disclosure.

FIG. 5 illustrates a 2-bit flash analog to digital converter of a type suitable for implementing the 4-bit ADC 214 of FIG. 2. It will be apparent to those skilled in the art how the circuit of FIG. 5 could be adapted to convert DC voltage levels into any N-bit digital value.

The ADC 500 comprises a resistive network for generating $2^N$ reference voltage levels based on a reference voltage $V_{REF}$. The resistive network for example comprises $2^N+1$ resistors coupled in series between the voltage $V_{REF}$ and ground. In the example of FIG. 5, N is equal to 2, and there are thus five resistors. Each resistor has a resistance of R, except the first and last resistors in the series, which have resistances of R/2. Resistance R is for example in the range 1 k to 10 k ohms. The four intermediate nodes between the resistors provide four reference voltage levels, which are respectively coupled to positive inputs of four comparators 502 to 508. The comparators 502 to 508 compare the respective reference levels to the input voltage $V_{IN}$ received from the transmission line 202. In particular, the negative input of each comparator 502 is for example connected directly to the transmission line 202. The comparator 502 receives the highest reference voltage and has its output coupled to one input of a NAND gate 510. The other input of NAND gate 510 is coupled to the output of comparator 504 via an inverter. The output of comparator 504 is also coupled to one input of a NAND gate 512, the other input of which is coupled to the output of comparator 506 via an inverter. The output of comparator 506 is also coupled to one input of a NAND gate 514, the other input of which is coupled to the output of comparator 508 via an inverter. The output of NAND gate 510 is coupled to one input of a NAND gate 516, and to one input of a NAND gate 518. The other input of NAND gate 516 is coupled to the output of NAND gate 512. The other input of NAND gate 518 is coupled to the output of NAND gate 514. The NAND gates 516 and 518 provide output bits B0 and B1 respectively of the ADC 500.

In some embodiments, the number of bits of data transmitted over the transmission interface by each DC level is variable, as will now be described with reference to FIGS. 6 to 8.

Figure 6:
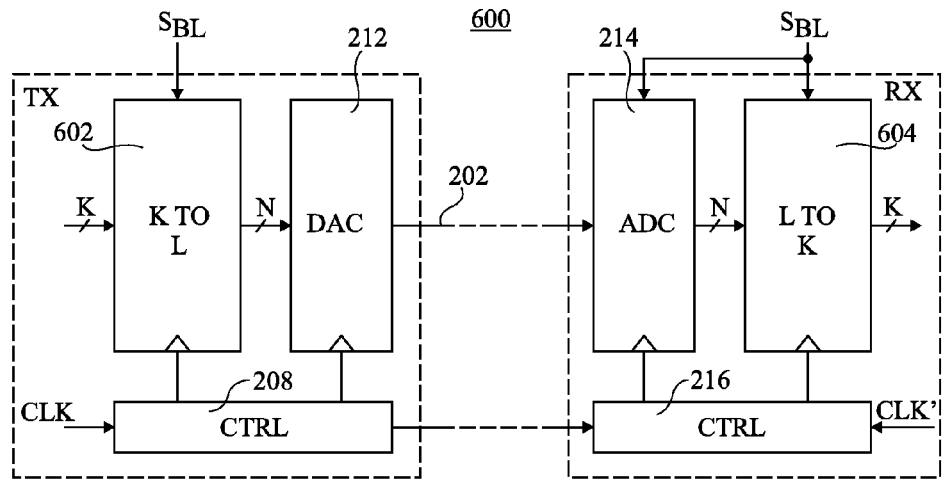
FIG. 6 schematically illustrates a serial data transmission system using multiple voltage levels according to a further example embodiment of the present disclosure.

FIG. 6 schematically illustrates a serial data transmission system 600 according to a further example embodiment of the present disclosure. Many elements of the system 600 are similar to elements of the system 200 of FIG. 2, and have been labeled with like references. However, the transmission side TX in FIG. 6 comprises a bit-length conversion and encoding circuit 602, and the reception side RX in FIG. 6 comprises a bit-length conversion and decoding circuit 604.

The bit-length conversion and encoding circuit 602 for example receives K-bit input values, where K is for example equal to or greater than N, and K is for example a multiple of N. The circuit 602 for example converts each K-bit input value into one or more L-bit values, where L is equal to or less than N. The number of bits L is for example variable, and is for example selected by the circuit 602 based on a bit-length control signal $S_{BL}$. Each N-bit input digital value provided to the DAC 212 is for example generated by encoding one of the L-bit values. For example, each N-bit digital value represents one of $2^N$ symbols, and $2^M$ of these symbols are used to represent the L-bit values.

In some embodiments, the bit-length conversion and encoding circuit 602 may comprise one or more of the multiplexers 210 of FIG. 2 for reducing the bit length of the input values, based on a corresponding clock signal received from the control circuit 208, in a fashion to what is described above in relation to FIG. 2.

The bit-length conversion and decoding circuit 604 for example receives the N-bit values from the ADC, and decodes each value to extract an L-bit value. The circuit 604 then for example converts each L-bit value back to a K-bit value, which is for example provided as the output signal. The circuit 604 for example receives the bit-length control signal $S_{BL}$ indicating the value of L. Furthermore, in some embodiments the ADC 214 also receives the control signal $S_{BL}$, and adjusts one or more of its reference voltage levels based on the value of L, which determines the DC voltage levels that are transmitted over the interface.

In some embodiments, the bit-length conversion and decoding circuit 604 may comprise one or more of the demultiplexers 220 of FIG. 2 for reducing the bit length of the input values, based on a corresponding clock signal received from the control circuit 216, in a similar fashion to what is described above with reference to FIG. 2.

Thus in the data transmission system 600 of FIG. 6, the number of bits transmitted over the interface on each clock edge may be varied. In other words, the number of DC voltage levels used to represent the data is variable. This permits an appropriate data compression level to be selected based on the quality of the transmission interface. Indeed, reducing the number of DC levels for example permits the voltage spacing between the levels to be increased, which in turn makes it easier for the reception side to distinguish between the voltage levels. In some embodiments, a return path is provided from the reception side RX to the transmission side TX, and a ping pong exchange may be used to periodically check the transmission quality, and generate the bit-length control signal accordingly. In the case that errors are detected, the value of L may be reduced.

An example of operation of the circuit of FIG. 6 will now be described with reference to FIG. 7 based on the case in which N is equal to 4. FIG. 7 is a timing diagram showing an example of the voltage signal transmitted over the data transmission interface. During a period 702, the full $2^N$ DC levels of the interface may be used, these levels being represented by dashed lines. Thus in this case L is for example equal to N. In the example of FIG. 7, during the period 702, the 4-bit value "0001" is transmitted, followed by the 4-bit value "1010".

It may however be determined that the error rate is too high, and thus during a subsequent period 704, L is for example reduced to 3 bits. The DAC 212 continues to receive 4-bit values, but only 8 DC levels are used. For example, the L-bit value "000" is encoded as the N-bit value of "0000,"the L-bit value of "001" is encoded as the N-bit value of "0010", and so on and so forth up to the L-bit value of "111", which is encoded as the N-bit value of "1110". In the example of FIG. 7, during the period 704; the 3-bit value "011" is transmitted by the N-bit value "0110"followed by the 3-bit value "111" by the N-bit value "1110".

It may again be determined that the error rate is too high, and thus during a subsequent period 706, L is for example reduced to 2 bits. The DAC 212 continues to receive 4-bit values, but now only 4 DC levels are used. For example, the L-bit value "00" is encoded as the N-bit value of "0000", the L-bit value of "01" is encoded as the N-bit value of "0101", the L-bit value of "10" is encoded as the N-bit value of "1010", and the L-bit value of "11" is encoded as the N-bit value of "1111". In the example of FIG. 7, during the period 706; the 2-bit value "01" is transmitted by the N-bit value "0101", followed by the 2-bit value "00" by the N-bit value "0000". On reception side RX, the bit-length conversion circuit 604 for example converts the received N-bit value to its closest L-bit value. For example, the N-bit values "0000", "0001" and "0010" are converted to the L-bit value "00", the N-bit values "0011", "0100", "0101", "0110" and "0111" are converted to the L-bit value "01", the N-bit values "1000", "1001"; "1010", "1011" and "1100" are converted to the L-bit value "10" and the N-bit values "1101", "1110" and "1111" are converted to the L-bit value "11".

It may again be determined that the error rate is too high, and thus during a subsequent period 708, L is for example reduced to 1 bit. The DAC 212 continues to receive 4-bit values, but now only 2 DC levels are used, which are for example VDD and ground. For example, the L-bit value "0" is encoded as the N-bit value of "0000", the L-bit value of "1" is encoded as the N-bit value of "1111". In the example of FIG. 7, during the period 708; the 1-bit value "1" is transmitted by the N-bit value "1111", followed by the 1-bit value "0" by the N-bit value "0000". Again, the bit-length conversion circuit 604 on the reception side for example converts each received N-bit value to the closest L-bit value. For example, N-bit values from "0000" to "0111" are converted to the L-bit value "0", and N-bit values from "1000" to "1111" are converted to the L-bit value "1".

Figure 7:
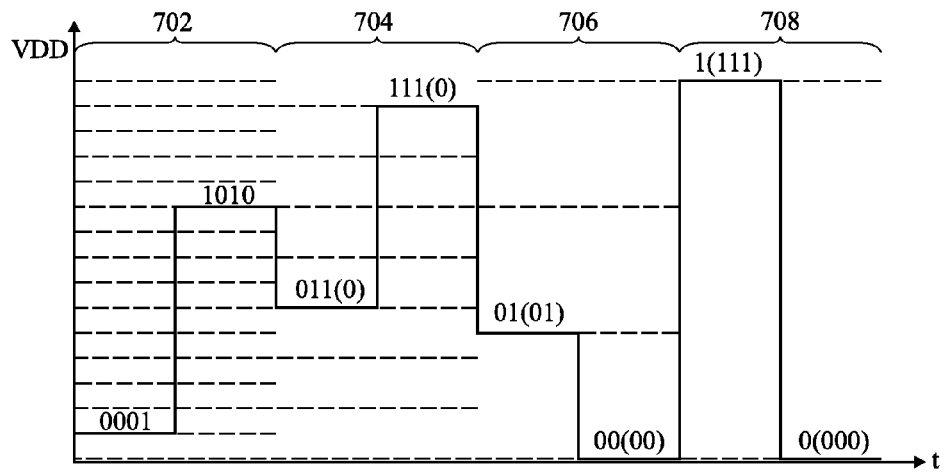
FIG. 7 is a timing diagram showing signals in the circuit of FIG. 6 according to an example embodiment of the present disclosure.

FIG. 7 provides a specific example according to which, over the successive periods 702, 704, 706 and 708, the number of bits L of data transmitted by each DC voltage level is progressively reduced from 4 bits to 1 bit. Of course in practice the value of L may be varied in many different ways, and it is for example kept constant as soon as the error rate on the interface has reaches an acceptable level.

Rather than providing the bit-length conversion circuits 602 and 604, in alternative embodiments a plurality of the transmission circuits TX and reception circuits RX of FIG. 2 could be provided in parallel, as will now be described in more detail with reference to FIG. 8.

Figure 8:
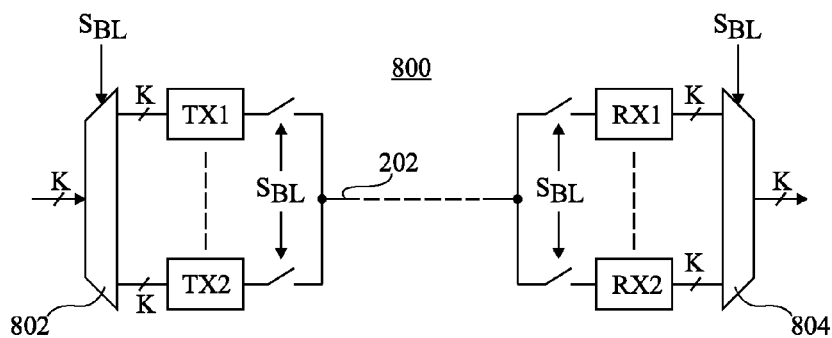
FIG. 8 schematically illustrates a serial data transmission system using multiple voltage levels according to yet a further example embodiment of the present disclosure.

FIG. 8 schematically illustrates a serial data transmission system 800 according to an example embodiment of the present disclosure. The system 800 for example comprises transmission circuits TX1 and TX2, each for example corresponding to the circuit TX of FIG. 2, and reception circuits RX1 and RX2, each for example corresponding to the circuit RX of FIG. 2. However, the circuits TX1 and RX1 are for example adapted to transmit/receive data using 2N DC levels, whereas the circuits TX2 and RX2 are for example adapted to transmit/receive data using 2Q DC levels, where Q is different to N. For example, in one example N is equal to 4, and Q is equal to 2. Furthermore, there may be further transmission and reception circuits (not illustrated) based on different numbers of DC levels.

The transmission circuits TX1 and TX2 for example each have an K-bit input coupled to corresponding outputs of a demultiplexer 802, which routes an K-bit input signal to one or the other of the circuits TX1, TX2 based on a bit-length control signal $S_{BL}$. The outputs of the transmission circuits TX1, TX2 are for example coupled via corresponding switches to the transmission line 202, the switches also for example being controlled based on the bit-length control signal $S_{BL}$.

The inputs of the reception circuits RX1, RX2 are for example coupled to the transmission line 202 via corresponding switches also for example controlled based on the bit-length control signal $S_{BL}$. Each of the reception circuits RX1, RX2 for example has an K-bit output coupled to a corresponding input of a multiplexer 804, which for example selects one of the outputs based on the bit-length selection signal $S_{BL}$.

As with the embodiment of FIG. 6, the number of bits transmitted over the interface in FIG. 8 on each clock edge may be varied using the bit-length control signal $S_{BL}$, which in this example is used to select the transmission/reception circuit TX1, RX1 or TX2, RX2 to be used. For example, a return path may be provided from the reception side RX to the transmission side TX, and a ping pong exchange may be used to check the transmission quality, and generate the bit-length control signal $S_{BL}$ accordingly.

An advantage of the embodiments described herein is that the transmission data rate of a serial interface can be increased without increasing the clock frequency, and therefore such an increase will not lead to the physical limits of the transmission line being exceeded. For example, assuming the case in which N is equal to 2, the data rate can be doubled for a given clock frequency without increasing the frequency of the signal applied to the transmission line. In fact, given that the voltage changes on the transmission line are likely to be less than the fall voltage swing of VDD, the frequency constraints on the transmission line will be relaxed. Furthermore, given that a single DC level represents more than one bit of data, there will also be a significant reduction in energy consumption.

An advantage of using a binary weighted DAC and/or a flash ADC is that such converters operate very rapidly, leading to only a relatively low increase in latency of the data transmission.

Having thus described at least one illustrative embodiment, various alterations, modifications and improvements will readily occur to those skilled in the art.

For example, it will be apparent to those skilled in the art that the supply voltage VDD in the various embodiments could be at any level, for example between 1 and 5 V, and rather than being at 0 V, the ground voltage can also be considered as a supply voltage that could be at any level, such as a negative level.

It will also be apparent to those skilled in the art that while examples have been illustrated in which the rising edges of clock signal provide the significant timing edge, in alternative embodiments the significant edge could be the falling edge, or both rising and falling edges. Furthermore, it will be apparent to those skilled in the art that timing information could be provided from the transmission side to the reception side by a clock signal supplied on a direct link, or alternatively a suitable protocol, for example based on start and stop bits, could be used over the transmission line so that the timing information can be determined on the reception side.

Furthermore, it will be apparent to those skilled in the art that the circuits of FIGS. 4 and 5 are merely example embodiments of a DAC and an ADC respectively, and that many alternative implementations would be possible.

Furthermore, it will be apparent to those skilled in the art that the various features described in relation to the various embodiments could be combined, in alternative embodiments, in any combination.

The invention claimed is:

1. A system comprising a data transmission circuit for transmitting a data signal over a transmission line, wherein the data transmission circuit comprises:
   a digital to analog converter (DAC) configured to receive N-bit input digital values of the data signal, generate therefrom $2^N$ different DC voltage levels by selecting one of the $2^N$ DC voltage levels in response to each received N-bit digital value, and apply the selected one of the $2^N$ DC voltage levels to the transmission line, wherein the DAC operates to apply, for consecutive received N-bit input digital values, the selected one of the $2^N$ DC voltage levels on each of a rising edge and a falling edge of a dock signal; and
   a multiplexer configured to receive a plurality of N-bit input digital values in parallel and time multiplex the plurality of N- bit input digital values for provision serially to the DAC, wherein the multiplexer receives two groups of N-bit input digital values in parallel and time multiplexes one of the two groups of N-bit input digital values on a rising edge of a clock signal and time multiplexes another of the two groups of N-bit input digital values on a falling edge of said clock signal, and $N>1$.

2. The system of claim 1, wherein the DAC comprises an amplifier circuit having an output coupled to the transmission line, the amplifier circuit having $2^N$ different gain levels for generating the $2^N$ different DC voltage levels.

3. The system of claim 1, further comprising a clock output line for transmitting to a reception circuit a clock signal along with each of the generated $2^N$ different DC voltage levels.

4. The system of claim 1, further comprising:
   a data reception circuit for receiving a voltage signal comprising said $2^N$ different DC voltage levels transmitted over the transmission line, the data reception circuit comprising:
   an analog to digital converter (ADC) configured to detect and differentiate between said received $2^N$ different DC voltage levels and convert each of the detected $2^N$ different DC voltage levels into a corresponding N-bit output digital value.

5. The system of claim 4, wherein the data reception circuit further comprises a bit-length conversion circuit adapted to:
   receive the N-bit output digital values from the ADC;
   extract an L-bit value from each N-bit output digital value, where L is equal to or less than N; and
   convert each L-bit value into an K-bit value, where K is greater than L.

6. The system of claim 5, wherein the bit-length conversion circuit is adapted to receive a bit-length control signal, and to select the number of bits L based on the bit-length control signal.

7. The system of claim 4, wherein the ADC operates to output, for consecutive received ones of the $2^N$ different DC voltage levels the corresponding N-bit output digital values on each of a rising edge and a falling edge of a clock signal.

8. The system of claim 4, further comprising a demultiplexer configured to serially receive a plurality of the N-bit output digital values from the ADC and generate a plurality of N-bit output digital values in parallel by time demultiplexing.

9. The system of claim 8, wherein the demultiplexer receives two consecutive ones of the plurality of N-bit output digital values from the ADC in series and time demultiplexes one group of two N-bit output digital values to generate two N-bit output digital values in parallel on a rising edge of a clock signal and time multiplexes another group of two N-bit output digital values to generate two N-bit output digital values in parallel on a falling edge of said clock signal.

10. A system comprising a data transmission circuit for transmitting a data signal over a transmission line, wherein the data transmission circuit comprises:

a digital to analog converter (DAC) configured to receive N-bit input digital values of the data signal, generate therefrom $2^N$ different DC voltage levels by selecting one of the $2^N$ DC voltage levels in response to each received N-bit digital value, and apply the selected one of the $2^N$ DC voltage levels to the transmission line, wherein the transmission circuit further comprises a bit-length conversion and encoding circuit adapted to:
receive K-bit input values;
convert each K-bit input value into one or more L-bit values, where L is less than N; and
generate each N-bit input digital value by encoding one of the L-bit values.

11. The system of claim 10, wherein the bit-length conversion circuit is adapted to receive a bit-length control signal, and to select the number of bits L based on the bit-length control signal.

12. The system of claim 10, further comprising a multiplexer configured to receive a plurality of N-bit input digital values in parallel and time multiplex the plurality of N-bit input digital values for provision serially to the DAC.

13. The system of claim 12, wherein the multiplexer receives two groups of N-bit input digital values in parallel and time multiplexes one of the two groups of N-bit input digital values on a rising edge of a clock signal and time multiplexes another of the two groups of N-bit input digital values on a falling edge of said clock signal.

14. The system of claim 10, wherein the DAC comprises an amplifier circuit having an output coupled to the transmission line, the amplifier circuit having $2^N$ different gain levels for generating the $2^N$ different DC voltage levels.

15. The system of claim 10, further comprising a clock output line for transmitting to a reception circuit a clock signal along with each of the generated $2^N$ different DC voltage levels.

16. A system comprising:
a data transmission circuit for transmitting a data signal over a transmission line, wherein the data transmission circuit comprises a digital to analog converter (DAC) configured to receive N-bit input digital values of the data signal, generate therefrom $2^N$ different DC voltage levels by selecting one of the $2^N$ DC voltage levels in response to each received N-bit digital value, and apply the selected one of the $2^N$ DC voltage levels to the transmission line, and
a further transmission circuit comprising:
a further digital to analog converter (DAC) configured to receive Q-bit input digital values of the data signal, generate therefrom $2^Q$ different DC voltage levels by selecting one of the $2^Q$ DC voltage levels in response to each received Q-bit digital value, and apply the selected one of the $2^Q$ DC voltage levels to the transmission line, wherein Q is not equal to N; and
a selection circuit adapted to select the transmission circuit or the further transmission circuit.

17. The system of claim 16, further comprising a data reception circuit for receiving a voltage signal comprising said $2^N$ different DC voltage levels transmitted over the transmission line, the data reception circuit comprising:
an analog to digital converter (ADC) configured to detect and differentiate between said received $2^N$ different DC voltage levels and convert each of the detected $2^N$ different DC voltage levels into a corresponding N-bit output digital value; and a further data reception circuit for receiving a voltage signal comprising said $2^Q$ different DC voltage levels transmitted over the transmission line, the further data reception circuit comprising:
a further analog to digital converter (ADC) configured to detect and differentiate between said received $2^Q$ different DC voltage levels and convert each of the detected $2^Q$ different DC voltage levels into a corresponding Q-bit output digital value; and
a further selection circuit adapted to select the data reception circuit or the further data reception circuit.

18. The system of claim 16, further comprising a multiplexer configured to receive a plurality of N-bit input digital values in parallel and time multiplex the plurality of N-bit input digital values for provision serially to the DAC.

19. The system of claim 18, wherein the multiplexer receives two groups of N-bit input digital values in parallel and time multiplexes one of the two groups of N-bit input digital values on a rising edge of a clock signal and time multiplexes another of the two groups of N-bit input digital values on a falling edge of said clock signal.

20. The system of claim 16, wherein the DAC comprises an amplifier circuit having an output coupled to the transmission line, the amplifier circuit having $2^N$ different gain levels for generating the $2^N$ different DC voltage levels.

21. The system of claim 16, further comprising a clock output line for transmitting to a reception circuit a clock signal along with each of the generated $2^N$ different DC voltage levels.

22. A data reception circuit for receiving a voltage signal transmitted over a transmission line, the circuit comprising:
an analog to digital converter (ADC) configured to differentiate between $2^N$ different DC voltage levels of the received voltage signal and to detect a DC voltage level on the voltage signal and convert each detected DC voltage level into a corresponding N-bit output data value,
wherein the ADC is configured to generate consecutive N-bit output digital values, based on consecutively received and detected DC voltage levels on a rising edge and a falling edge of a clock signal; and
a demultiplexer configured to serially receive the consecutive N-bit data values output from the ADC and generate a plurality of N-bit output digital values in parallel by time demultiplexing a plurality of the serially received N-bit output digital values, wherein the demultiplexer is further configured to generate two N-bit digital values in parallel by time demultiplexing the plurality of N-bit digital values on rising and falling edges of a clock signal and N>1.

23. A data reception circuit for receiving a voltage signal transmitted over a transmission line for receiving a voltage signal transmitted over a transmission line, wherein the data reception circuit comprises:
an analog to digital converter (ADC) configured to differentiate between $2^N$ different DC voltage levels of the voltage signal and to detect a DC voltage level on the voltage signal and convert each detected DC voltage level into a corresponding N-bit output data value, and
a bit-length conversion circuit adapted to:
receive the N-bit output digital values from the ADC;
extract an L-bit value from each N-bit output digital value, where L is equal to or less than N; and
convert each L-bit value into a K-bit value, where K is greater than L.

24. The data reception circuit of claim 23, wherein the bit-length conversion circuit is adapted to receive a bit-length control signal, and to select the number of bits L based on the bit-length control signal.

25. The data reception circuit of claim 23, further comprising a demultiplexer configured to serially receive the consecutive N-bit data values output from the ADC and generate a plurality of N-bit output digital values in parallel by time demultiplexing a plurality of the serially received N-bit output digital values.

26. The data reception circuit of claim 25, wherein the demultiplexer is further configured to generate two N-bit digital values in parallel by time demultiplexing the plurality of N-bit digital values on rising and falling edges of a clock signal.

27. A data reception circuit for receiving a voltage signal transmitted over a transmission line, comprising:
    an analog to digital converter (ADC) configured to differentiate between $2^N$ different DC voltage levels of the voltage signal and to detect a DC voltage level on the voltage signal and convert each detected DC voltage level into a corresponding N-bit output data value, wherein the ADC comprises:
        a resistor network configured to generate $2^N-1$ reference voltage levels, and
        $2^N-1$ comparators configured to compare corresponding ones of the reference voltage levels with each DC voltage level detected on the transmission line.

28. The data reception circuit of claim 27, further comprising a demultiplexer configured to serially receive the consecutive N-bit data values output from the ADC and generate a plurality of N-bit output digital values in parallel by time demultiplexing a plurality of the serially received N-bit output digital values.

29. The data reception circuit of claim 28, wherein the demultiplexer is further configured to generate two N-bit digital values in parallel by time demultiplexing the plurality of N-bit digital values on rising and falling edges of a clock signal.

30. A system comprising a data transmission circuit for transmitting a data signal over a transmission line,
    wherein the data transmission circuit comprises:
        a digital to analog converter (DAC) configured to receive N-bit input digital values of the data signal, generate therefrom $2^N$ different DC voltage levels by selecting one of the $2^N$ DC voltage levels in response to each received N-bit input digital value, and apply the selected one of the $2^N$ DC voltage levels to the transmission line,
        wherein the data transmission circuit further comprises a bit-length conversion and encoding circuit adapted to generate each N-bit input digital value by encoding one of an L-bit values; and
    a multiplexer configured to receive two groups of N-bit input digital values in parallel and time multiplex one of the two groups of N-bit input digital values on a rising edge of a clock signal and time multiplex another of the two groups of N-bit input digital values on a falling edge of said clock signal for provision serially to the DAC, N>1.

31. The system of claim 30, wherein the DAC comprises an amplifier circuit having an output coupled to the transmission line, the amplifier circuit having $2^N$ different gain levels for generating the $2^N$ different DC voltage levels.

32. The system of claim 30, further comprising a clock output line for transmitting to a reception circuit the clock signal along with each of the generated $2^N$ different DC voltage levels.

33. A system comprising a data transmission circuit for transmitting a data signal over a transmission line, wherein the data transmission circuit comprises:
    a bit-length conversion and encoding circuit adapted to:
        receive input values of the digital signal, each having a first bit length;
        convert each input value into one or more converted values, each having a second bit length (X), by encoding each of the input values,
        wherein the second bit length is greater than the first bit length,
        wherein the second bit length is variable in response to a bit-length control signal representative of a transmission quality; and
    a digital to analog converter (DAC) configured to receive the converted values, generate therefrom $2^X$ different DC voltage levels by selecting one of $2^X$ DC voltage levels in response to each received converted value, and apply the selected one of the $2^X$ DC voltage levels to the transmission line.

* * * * *